(12) United States Patent
Sberno et al.

(10) Patent No.: US 6,930,907 B2
(45) Date of Patent: Aug. 16, 2005

(54) FERAM SEMICONDUCTOR MEMORY (75) Inventors: Giampiero Sberno, Catania (IT); Salvatore Torrisi, Catania (IT); Nicolas Demange, Lessy (FR)

(73) Assignee: STMicroelectronics S.r.l., Agrate Brianza (IT)

( * ) Notice: Subject to any disclaimer, the term of this patent is extended or adjusted under 35 U.S.C. 154(b) by 144 days.

(21) Appl. No.: 10/414,252

(22) Filed: Apr. 14, 2003

(65) Prior Publication Data
US 2003/0234413 A1 Dec. 25, 2003

(30) Foreign Application Priority Data
Apr. 15, 2002 (IT) ...................................... MI2002A0793

(51) Int. Cl.[7] .............................................. G11C 11/22
(52) U.S. Cl. ............................ 365/145; 365/51; 365/63
(58) Field of Search ............................ 365/145, 51, 63, 365/230.03

(56) References Cited

U.S. PATENT DOCUMENTS

| | | | | | |
|---|---|---|---|---|---|
| 6,091,622 | A | * | 7/2000 | Kang | ........................ 365/145 |
| 6,185,123 | B1 | * | 2/2001 | Allen et al. | ................. 365/145 |
| 6,201,727 | B1 | * | 3/2001 | Jeon | ........................... 365/145 |
| 6,317,380 | B1 | * | 11/2001 | Kang | ..................... 365/230.06 |
| 6,330,180 | B2 | * | 12/2001 | Noro et al. | .................. 365/145 |
| 6,377,498 | B1 | * | 4/2002 | Kang | ........................... 365/145 |
| 6,501,674 | B2 | * | 12/2002 | Ashikaga | .................... 365/145 |
| 6,504,748 | B2 | * | 1/2003 | Choi et al. | ................... 365/145 |
| 6,587,366 | B2 | * | 7/2003 | Tanaka | ........................ 365/145 |
| 6,625,053 | B2 | * | 9/2003 | Takashima | .................. 365/145 |

* cited by examiner

*Primary Examiner*—Tan T. Nguyen
(74) *Attorney, Agent, or Firm*—Lisa K. Jorgenson; Bryan A. Santarelli; Graybeal Jackson Haley LLP (57) ABSTRACT

A ferroelectric semiconductor memory includes an arrangement of memory units comprising at least one row of memory units. The memory units of the at least one row are associated with a respective word line of the arrangement. The arrangement of memory unit includes a plurality of local word lines branching off from the word line associated with the at least one row, each local word line being connected to a respective group of memory units of the line. Selective connection means allow to selectively connect one of the local word lines to the respective word line. The arrangement of memory units further includes a plurality of local plate biasing lines, each one associated with the memory units of a respective group of memory units, for selectively driving the memory units of the respective groups.

26 Claims, 5 Drawing Sheets

FERAM SEMICONDUCTOR MEMORY

PRIORITY CLAIM

This application claims priority from Italian patent application No. MI2002A000793, filed Apr. 15, 2002, which is incorporated herein by reference.

TECHNICAL FIELD

The present invention relates generally to the field of semiconductor memory devices, and particularly to non-volatile memories. More specifically, the invention concerns a ferroelectric non-volatile memory of the type referred to as FeRAM.

BACKGROUND OF THE INVENTION

Ferroelectric, non-volatile memories have memory cells consisting of a selection transistor, or access transistor, and, connected in series to the selection transistor, a storage capacitor whose dielectric is formed by a film of ferroelectric material.

Applying an electric field of sufficient intensity to the storage capacitor, the ferroelectric material becomes polarized in the direction of the electric field, and, thus, the polarization achieved is also maintained after the electric field is removed. If, at a later time, an electric field is applied to the storage capacitor having sufficient intensity and direction opposite to the direction of the polarization previously achieved, the ferroelectric material becomes polarized in the opposite direction and remains polarized in such opposite direction even after the removal of the electric field. The polarization of the ferroelectric material has the effect of producing a nonzero, electric charge for unit storage capacitor area, and such a charge persists even when no voltage is applied to the capacitor and does not disappear with time.

A binary information (bit) can, thus, be stored in the memory cell, by associating the two logic states, "1" and "0", with the two opposite polarization directions of the storage capacitor.

Ferroelectric memories are also called ferroelectric RAMs or FeRAMs, due to the similarities of their memory cells with the memory cells of a dynamic RAM (DRAM), which, as known, are also formed by a transistor and a capacitor connected in series.

Two families of FeRAMs are known, mainly differing from one another in the number of memory cells employed for storing a single bit.

The FeRAMs belonging to a first family use a single memory cell as a bit storage unit, or memory unit; for this reason, these FeRAMs are also called "1T1C" (standing for one transistor, one capacitor). Thanks to the simplicity of their memory units, these memories can have very large size, of the order of the megabits.

The FeRAMs of a second family employ two memory cells as a memory unit; for this reason, the FeRAMs of this second family are called "2T2C" (two transistors, two capacitors). The 2T2C FeRAMs occupy more area than the 1T1C FeRAMs, but the operation of data reading is less complicated compared to 1T1C FeRAMs, because one of the two cells of a memory unit acts as a reference signal generator for the other cell.

As in other memory devices, the memory cells in FeRAMs are arranged by rows and columns, to form a matrix. Each memory cell has the gate of the respective selection transistor connected to a word line of the matrix, the drain of the selection transistor connected to a bit line of the matrix and the free plate of the respective storage capacitor connected to a plate biasing line (shortly, a plate line) of the matrix.

According to a suitable arrangement of the matrix, the memory cells belonging to a same row of the matrix share the same word line and the same plate line; the memory cells belonging to a same column of the matrix share the same bit line.

Accessing a memory cell for reading the datum contained therein is an operation that comprises a succession of phases. In a first phase, also referred to as pre-charge phase, the bit line and the plate line associated with the cell to be read are biased to prescribed initial electric potentials, typically to the reference potential of the memory (ground); in this phase, the electric potential of the word line associated with the memory cell is also kept to ground. Subsequently, the potential of the word line is raised to a prescribed value, for instance corresponding to the supply voltage of the memory (VDD); in this way, the selection transistor of the memory cell is turned on, connecting a plate of the storage capacitor to the bit line. Then, the potential of the plate line is also raised to VDD: this causes an electric potential to be established on the bit line, such electric potential depending on the polarization state of the storage capacitor. A read phase follows, in which the read circuits sense the electric potential that has been established on the bit line, and properly amplify it.

The following phase, also called restore phase, is directed to restoring the datum initially contained in the memory cell; it is, in fact, known that reading an FeRAM memory cell in a given polarization state destroys the datum stored therein, because the storage capacitor is brought into a final polarization state opposite to the initial polarization state. In a "1T1C" memory unit, the destruction of the datum only occurs if the cell is initially in one of the two possible states, while in a "2T2C" memory unit the destruction of the datum always takes place, because the two cells making up the memory unit are always in initially opposed states.

In the restore phase, after having brought the potential of the bit line to ground or to VDD, depending on the polarization state of the storage capacitor, the plate line is brought to ground; since the electric potential applied to the bit line in the case in which the storage capacitor has experienced a polarization state transition is equal to VDD, an electric field favorable to the re-estabslishment (restore) of the initial polarization state is applied to the storage capacitor.

In the final phase of the read operation, all the electric potentials of the different lines are reset to the initial state.

In the data restore phase, the selection transistors have to be properly overdriven, so as to be capable of transferring to the storage capacitors the full voltage that the read circuits place on the bit lines. In particular, in order to be capable of transferring the full voltage VDD to the plate of the respective storage capacitor, the gate of a selection transistor must be driven to a voltage at least equal to (VDD+Vth), where Vth denotes the threshold voltage of the selection transistor.

Several techniques are known for overdriving the selection transistors; all these techniques can, however, be classified according to three principles.

A first solution calls for integrating, in the memory, charge pumps that, starting from the supply voltage VDD, generate a higher voltage, fed to the word line that, in the restore phase, is selected so as to be accessed.

The disadvantage of such solution resides in that the semiconductor chip area is occupied by the charge pumps that include capacitors, diodes, a generator of phases for driving the capacitors and an output voltage regulator. Further, area needs to be reserved for the routing of the lines necessary to bring the output voltage of the charge pumps to the word lines. Another drawback is the power consumption of these circuits; in order to limit such power consumption, it is necessary to implement charge pump turn-off and turn-on schemes, that, however, contribute to increasing the area occupied.

A second solution calls for integrating voltage boost capacitors, one for each word line or for a group of word lines. Charging to the voltage VDD the capacitor associated with the word line to be boosted, and then raising the potential of the free plate of the capacitor, it is possible to raise the word line potential enough so as to overdrive the selection transistors.

Also, this solution has the disadvantage of involving a great waste of area.

A third solution relies on the bootstrap effect that is induced on the word line voltage by the raising of the bit line voltage. Such effect takes place thanks to the capacitive coupling between the bit line and the word line, and, therefore, allows raising the word line electric potential enough so that the selection transistor can transfer the full voltage VDD present on the bit line to the ferroelectric capacitor.

This last solution is the least expensive from the point of view of chip area and power consumption because it does not require additional circuitry; neither does it require further area to be reserved for the routing of the voltage generated by the charge pumps. Nevertheless, this solution poses limitations to the design of the memory cells arrangement.

In fact, the bootstrap effect takes place thanks to the electric charge partition between the equivalent capacitance seen by the bit line toward the selected word line, and the word line capacitance. Such charge partition takes place when the bit line is brought to the voltage VDD, which happens when the storage capacitor connected to the bit line changes the polarization state thereof.

In order to ensure that the bootstrap effect is not frustrated by the presence, on the same word line, of non-accessed memory units, the length of the word line has to coincide with the length of the plate line. This contrasts with the desire of being able to selectively access only some memory units of the word line so as not to cause an unnecessary fatigue on the memory units that do not need to be read.

SUMMARY OF THE INVENTION

In view of the state of the art described, an embodiment of the present invention provides a ferroelectric memory in which the overdrive of the word lines in the data restore phase can be achieved through the advantageous technique of the bootstrap effect, and that, nevertheless, does not show the aforementioned limitations.

In summary, such a memory includes an arrangement of memory units, comprising at least one row of memory units; the memory units of the at least one row are associated with a respective word line of the arrangement.

In the arrangement of memory units, a plurality of local word lines is provided, branching off from the word line associated with the at least one row; each local word line is connected to a respective group of memory units of the row.

Selective connection means are provided, which are activatable for selectively connecting one of the local word lines to the respective word line.

BRIEF DESCRIPTION OF THE DRAWINGS

The features and the advantages of the present invention will be made apparent by the following detailed description of one embodiment thereof, provided merely by way of non-limitative example, that will be made with reference to the attached drawings, wherein.

DETAILED DESCRIPTION

Figure 1:
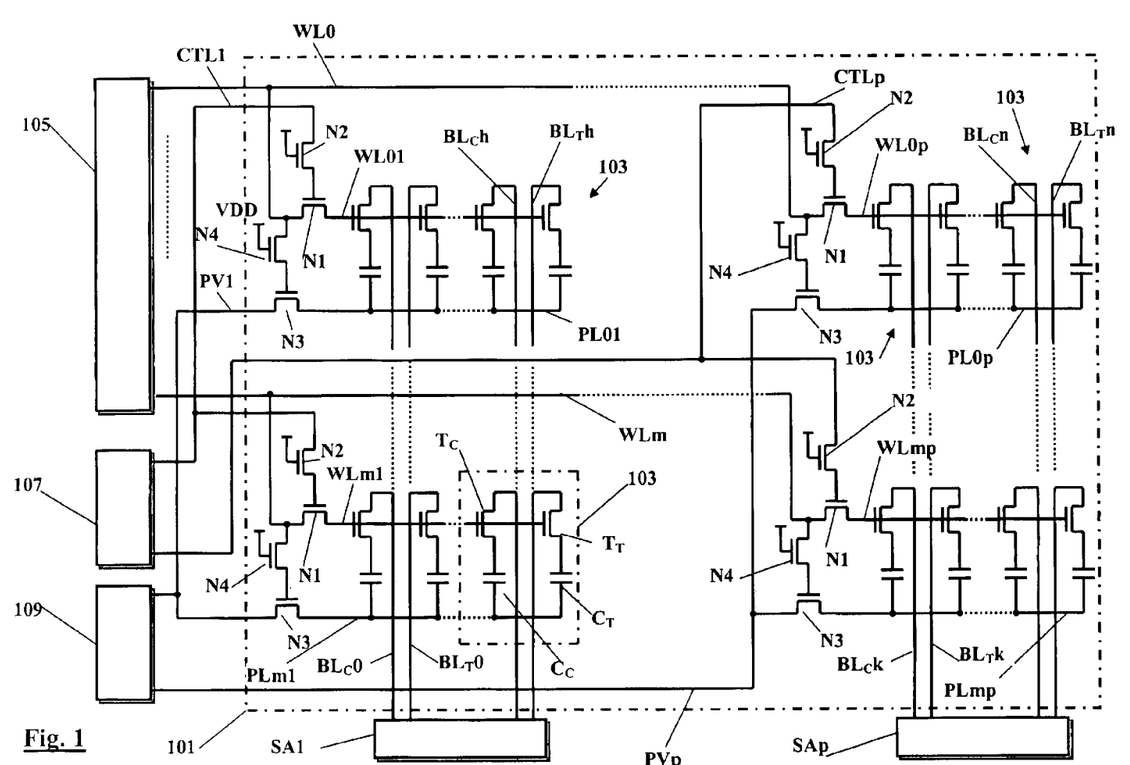
FIG. 1 is a schematic diagram of an FeRAM memory according to an embodiment of the present invention, particularly a "2T2C" memory.

Making reference to FIG. 1, an FeRAM ferroelectric memory according to an embodiment of the present invention is schematically depicted. In particular, the FeRAM memory shown in FIG. 1 is of the "2T2C" type.

The memory includes a bidimensional arrangement or matrix 101 of memory units 103, each one adapted to store a binary unit of information ("bit").

Each memory unit includes two FeRAM memory cells. Each FeRAM memory cell is formed of a selection transistor $T_C$, $T_T$, for instance, an N-channel MOSFET; in series to the source of the selection transistor $T_C$, $T_T$, a storage capacitor $C_c$, $C_T$ is provided, whose dielectric comprises a ferroelectric material.

The memory units 103 are arranged in a plurality of rows and a plurality of columns. A respective word line WL0–WLm corresponds to each row of the matrix. A respective pair of bit lines $BL_C0$, $BL_T0$–$BL_Cn$, $BL_Tn$ corresponds to each column of the matrix.

The memory units 103 that belong to a same matrix column have the two selection transistors $T_C$ and $T_T$, respectively, connected, through the drains, to one and to the other bit line $BL_C0$, $BL_T0$–$BL_Cn$, $BL_Tn$ of the bit line pair corresponding to such column.

The memory units 103 belonging to a same row of the matrix are divided into a plurality of groups. The gates of the selection transistors $T_C$, $T_T$ of the memory units 103 that belong to a same group are connected to a same local word line WL01–WL0p, ... , WLm1–WLmp. Each local word line WL01–WL0p, ... , WLm1–WLmp is coupled to the respective word line WL0–WLm through respective selective connection means, for instance, a switch formed by an N-channel MOSFET N1. The MOSFET N1 associated with each local word line WL01–WL0p, ... , WLm1–WLmp is controlled by a respective control signal CTL1–CTLp, fed to the gate of the MOSFET N1 through an N-channel MOSFET N2 permanently turned on (for instance, with gate connected to the supply voltage VDD of the memory).

The free plates of the storage capacitors $C_C$, $C_T$ of the memory units 103 belonging to a same group are connected to a same local plate line PL01–PL0p, . . . , PLm1–PLmp. Each local plate line PL01–PL0p, . . . , PLm1–PLmp is coupled to a respective plate biasing line PV1–PVp through respective selective connection means, for instance, a switch formed by an N-channel MOSFET N3. The MOSFET N3 is controlled by the potential of the respective word line WL0–WLm, fed to the gate of the MOSFET N3 through an N-channel MOSFET N4 permanently turned on (for instance, with gate connected to the supply voltage VDD of the memory).

The word lines WL0–WLm are driven by a word line selector 105, conventionally comprising a row address decoder.

A local word line selector 107 drives the control signals CTL1–CTLp. The assertion of a control signal CTL1–CTLp causes the activation of the MOSFETs N1 that are controlled by such control signal, and, therefore, the electric connection of one local word line WL01–WL0p, . . . , WLm1–WLmp within each row of the matrix to the respective word line WL0–WLm. In such a way, the electric potential of one local word line in each word line is brought to the electric potential of the corresponding word line. A local word line is selected when the corresponding word line is selected by the word line selector 105 and the respective MOSFET N1 is turned on.

The memory further includes a control circuit 109 for controlling the plate biasing lines; the control circuit 109 drives the plate biasing lines PV1–PVp to the prescribed electric potential.

The bit line pairs $BL_C0$, $BL_T0$–$BL_Cn$, $BL_Tn$ are gathered in groups of bit line pairs $BL_C0$, $BL_T0$–$BL_Ch$, $BL_Th$, . . . , $BL_Ck$, $BL_Tk$–$BL_Cn$, $BL_Tn$. Each group of bit line pairs $BL_C0$, $BL_T0$–$BL_Ch$, $BL_Th$, . . . , $BL_Ck$, $BL_Tk$–$BL_Cn$, $BL_Tn$ is associated with the groups of memory units 103 belonging to homologous groups of memory units of the different rows of the matrix 101. Particularly, the group of bit line pairs $BL_C0$, $BL_T0$–$BL_Ch$, $BL_Th$ is associated with the memory units 103 of the local word lines WL01–WLm1, and so on up to the group of bit line pairs $BL_Ck$, $BL_Tk$–$BL_Cn$, $BL_Tn$, that is associated with the local word lines WL0p–WLmp.

Each group of bit line pairs $BL_C0$, $BL_T0$–$BL_Ch$, $BL_Th$, . . . , $BL_Ck$, $BL_Tk$–$BL_Cn$, $BL_Tn$ is afferent to a respective group SA1–SAp of read circuits.

Each group of memory units 103 connected to a local word line WL01–WLmp forms, for example, a memory location or memory word.

In an alternative embodiment, only one group of read circuits can be provided for, which can be selectively connected to the different bit line groups $BL_C0$, $BL_T0$–$BL_Ch$, $BL_Th$, . . . , $BL_Ck$, $BL_Tk$–$BL_Cn$, $BL_Tn$, for instance, through a multiplexing structure exploiting the control signals CTL1–CTLp.

Figures 2, 4:
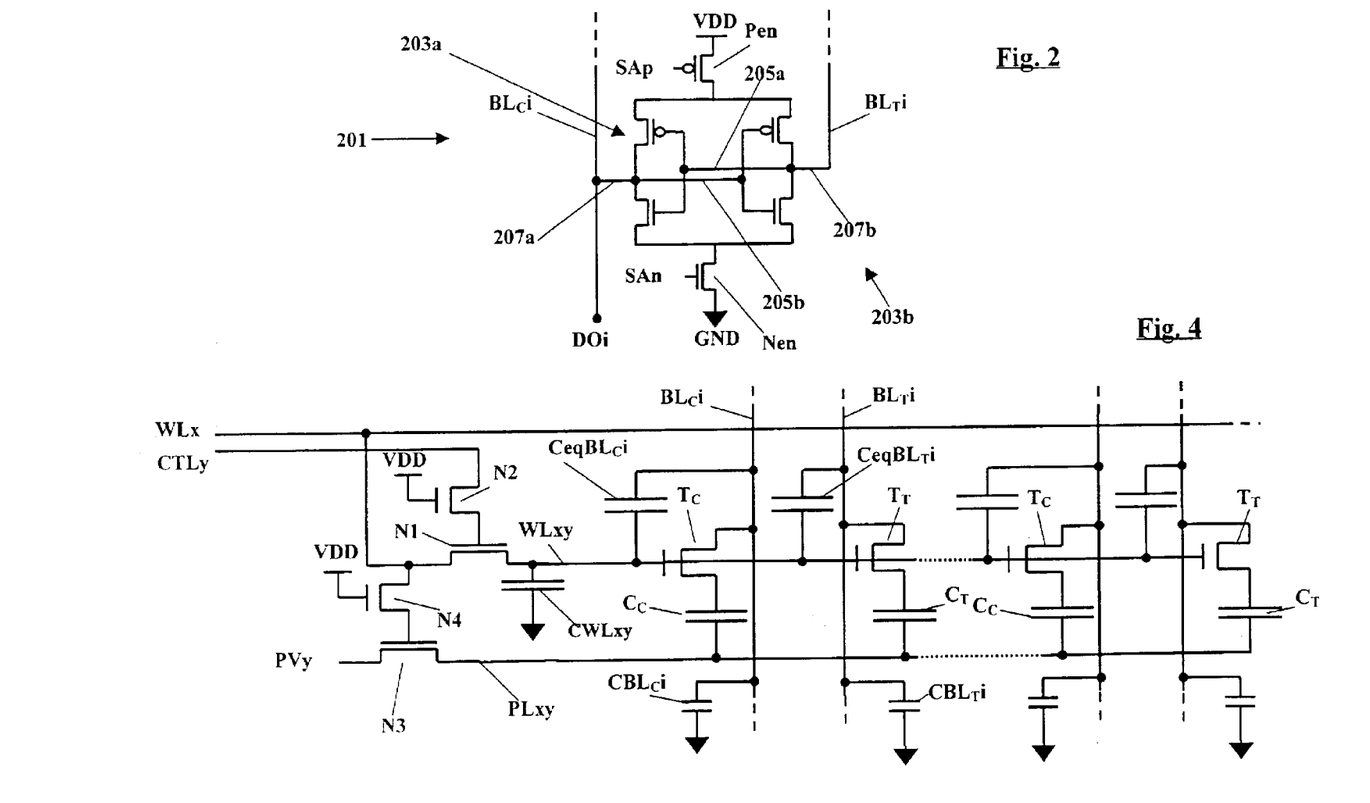
FIG. 2 is a circuit diagram of a read circuit of the memory of FIG. 1 according to an embodiment of the invention.
FIG. 4 shows, in detail, a local word line of the memory of FIG. 1, evidencing capacitances associated with the local word line, the bit lines and equivalent coupling capacitances between the bit lines and the local word line according to an embodiment of the invention.

FIG. 2 is a circuit diagram of a typical read circuit for a "2T2C" ferroelectric memory unit. The read circuit, denoted as 201, is associated with a generic bit line pair $BL_Ci$, $BL_Ti$ of the matrix 101. The read circuit 201 includes a pair of CMOS inverters 203a, 203b cross-connected to each other so as to form a latch. The inverter 203a has an input 205a connected to a bit line $BL_Ti$ of the bit line pair and an output 207a connected to the other bit line $BL_Ci$ of the bit line pair.

Dually, the inverter 203b has an input 205b connected to the bit line $BL_Ci$, and, therefore, to the output 207a of the inverter 203a, and an output 207b connected to the bit line $BL_Ti$, and, therefore, to the input 205a of the inverter 203a. The read circuit 201 has an output line DOi on which the read datum is made available; the output line can indifferently be connected to the output 207a of the inverter 203a (as in the shown example) or to the output 207b of the inverter 203b.

The read circuit 201 further includes respective enabling means, in the example constituted by a pair of MOSFETs Pen, Nen, controlled by respective enable signals Sap, San, handled by a memory control circuit (not shown) that controls the operation thereof. The MOSFET Pen is, for instance, a P-channel MOSFET, and allows the selective connection of the pair of CMOS inverters 203a, 203b to a supply voltage line, for instance, the supply voltage VDD of the memory. The MOSFET Nen is, for instance, an N-channel MOSFET, and allows selectively connecting the pair of CMOS inverters to a voltage reference line (ground) GND. In order to enable the read circuit, the two MOSFETs Pen and Nen must be both turned on, so as to power the pair of CMOS inverters.

The operation of the memory will be the described in the following making reference to a first type of access cycle, shown in the time diagram of FIG. 3. This drawing also shows, for the different phases of the read operation, the evolution of the polarization state of the storage capacitors of an accessed memory unit. In particular, the upper line relates to the capacitor $C_T$ of the memory unit that is assumed to be in an initial polarization state such that, during the read operation, an inversion of the initial polarization state takes place; the lower line relates instead to the storage capacitor $C_C$ that is supposed to be in an initial polarization state that does not change during the read operation. The polarization state of the storage capacitors is represented by a dot that moves on an hysteresis cycle of the ferroelectric material, in a Cartesian plane with, in abscissa, the electric potential difference seen by the storage capacitor (the electric potential on the plate connected to the plate line minus the electric potential on the plate connected to the bit line), and, in ordinate, the electric charge on the plates of the capacitor.

Figure 3:
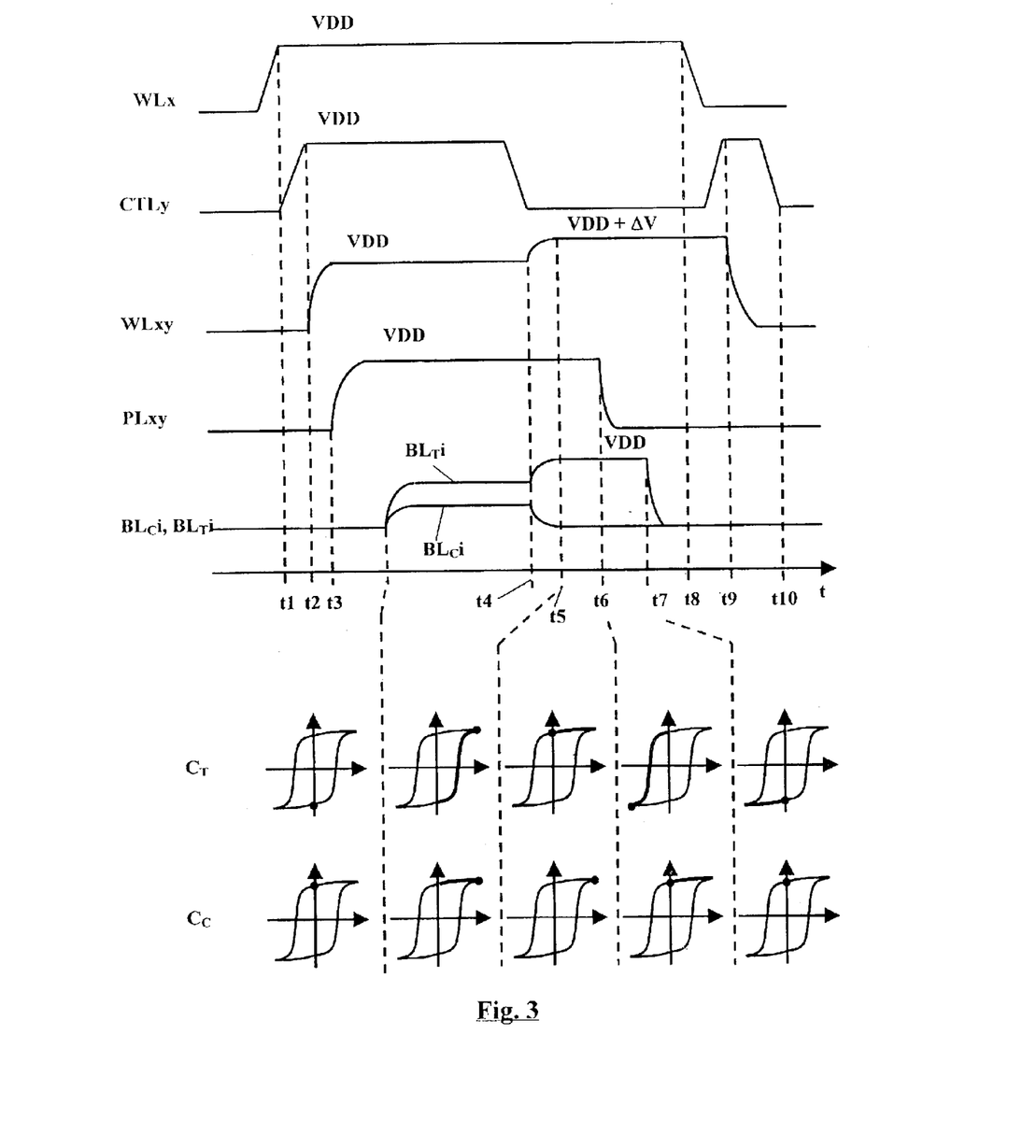
FIG. 3 is a time diagram showing the evolution in time of the main signals in the memory of FIG. 1, during a read operation carried out according to a first type of access cycle according to an embodiment of the invention.

It will be additionally assumed that the memory units 103 of a generic local word line WLxy of a generic word line WLx among the word lines WL0–WLm are accessed, and particularly, in the diagram of FIG. 3, the evolution of the potential of a generic bit line pair $BL_Ci$, $BL_Ti$ is shown. Reference will also be made to FIG. 4, in which an accessed local word line is shown in detail.

In order to access the memory units containing the desired data, an address is provided to the memory that identifies the row to which such memory units belong. On the basis of the address received, the word line selector 105 selects the word line WLx, whose electric potential, at the instant t1, is brought to a prescribed value (typically the supply voltage VDD of the memory, for instance 5 V), adapted to cause the turning on of the selection transistors $T_C$, $T_T$ of the memory units 103; all the remaining word lines of the matrix 101 are brought to an electric potential (for instance, the ground) adapted to inhibit the turning on of the selection transistors of the respective memory units.

Still on the basis of the address provided to the memory, the local word line selector 107 asserts the control signal CTLy corresponding to the local word line WLxy to which the memory units to be accessed are connected. The control signal CTLy is asserted bringing the respective potential to a value sufficient to determine the turning on of the MOSFET N1 that couples the local word line WLxy to the word line WLx. In the drawing, the assertion of the control signal CTLy is shown as taking place at the instant t2, with a slight delay with respect to the instant t1, nevertheless, the control signal CTLy could be asserted substantially simultaneous to the selection of the word line WLx, or even before.

The assertion of the control signal CTLy causes the MOSFET N1 to turn on, so that the electric potential of the local word line WLxy progressively raises up to the electric potential of the word line WLx, i.e. to the voltage VDD; the slope is approximately exponential, because the local word line is loaded by the gate capacitance of the selection transistors of the respective storage units (such capacitance is represented by the capacitor CWLxy in FIG. 4). The remaining local word lines associated with the word line WLx are not selected, because the respective MOSFETs N1 are off. It is pointed out that the presence of the MOSFET N2 in series to the gate of the MOSFET N1 make it possible to have a local voltage boost of the gate of the MOSFET N1 when the potential of the word line WLx is brought to the voltage VDD; this voltage boost is determined by the capacitive coupling of the word line WLx to the gate of the MOSFET N1, through the gate-drain capacitance of the latter. The voltage boost of the gate of the MOSFET N1 makes it possible to transfer the full voltage VDD present on the word line WLx onto the local word line WLxy, without electric potential drops; this speeds up the charging of the capacitance associated with the local word line WLxy.

The turning on of the selection transistors $T_C$ and $T_T$ of the memory units 103 that belong to the local word line WLxy causes the connection of the respective storage capacitors $C_C$ and $C_T$ to the respective bit lines of one of the groups of bit line pairs $BL_C0$, $BL_T0$–$BL_Ch$, BLTh, . . . , $BL_Ck$, $BL_Tk$–$BL_Cn$, $BL_Tn$.

The selection of the word line WLx also causes the MOSFET N3 to be turned on, thus, connecting the local plate lines associated with the local word lines of the word line WLx to the respective plate biasing lines PV1–PVp; the local plate lines associated with the local word lines of the remaining word lines are instead left disconnected from the plate biasing lines PV1–PVp.

Subsequent to the selection of the local word line WLxy, at the instant t3, the circuit 109 switches the plate biasing line that corresponds to the local plate line PLxy from an initial electric potential corresponding to ground to a prescribed access electric potential to the storage units, higher and, for instance, equal to the memory supply voltage VDD. Therefore, the potential of the local plate line PLxy, and, thus, of the free plates of the storage capacitors $C_C$, $C_T$ of the memory units 103 of the local word line WLxy, raises toward the voltage VDD. Similarly to that described above in connection with the MOSFETs N1 and N2, the gate of the MOSFET N3 experiences a local voltage boost due to the capacitive coupling between the plate biasing line and the gate of the MOSFET N3; in such a way, the MOSFET N3 allows transferring the full voltage VDD present on the respective plate biasing line to the local plate line PLxy.

The reading of the memory units 103 belonging to the selected local word line WLxy is carried out in the conventional way: by partition of the charge of the storage capacitors $C_C$, $C_T$ on the capacitances associated with the respective bit lines (such as, for instance, the capacitances of the capacitors $CBL_Ci$, $CBL_Ti$ shown in FIG. 4, associated with the bit lines $BL_Ci$, $BL_Ti$ and connected between the latter and ground), the potential of the bit lines evolves according to the polarization state of the storage capacitors. As visible in FIG. 3, the storage capacitor $C_C$, initially in the state conventionally identified as "up", does not change polarization state, differently from the storage capacitor $C_T$, initially in the "down" state, that is instead brought into the "up" state.

At the instant t4, when the respective electric potential is established on the bit lines, the read circuits of the group to which the group of bit line pairs connected to the memory units 103 of the local word line WLxy is coupled are enabled. The enabling of the read circuits is determined by asserting the enable signals SAp and SAn shown in FIG. 2. Considering the generic bit line pair $BL_Ci$ and $BL_Ti$, the respective electric potentials are always unbalanced, because the two storage capacitors of the associated memory unit are always in mutually opposite polarization states. Such an electric potential unbalance is sensed by the respective read circuit, that switches amplifying the initial unbalance. For instance, as shown in FIG. 3, the bit line $BL_Ci$ is brought to ground, while the bit line $BL_Ti$ is brought to the voltage VDD. After the read circuit has switched, a logic state corresponding to the datum contained in the storage unit appears at the output line DOi.

At the instant t5, the raise of the electric potential of the bit line $BL_Ti$ to the voltage VDD determines, by bootstrap effect, the voltage boost of the local word line WLxy, whose electric potential passes from the value VDD to a higher value. To this purpose, the local word line WLxy has to be disconnected from the word line WLx; to such end, the control signal CTLy has to be deasserted, so as to turn the MOSFET N1 off: for example, this can take place immediately before the instant t4, as shown in the diagram in FIG. 2.

As shown in FIG. 4, the bit lines, for instance, the bit line pair $BL_Ci$, $BL_Ti$, are capacitively coupled to the local word line WLxy through respective capacitances, shown in the drawing as capacitors, for instance, the capacitors $CeqBL_Ci$, $CeqBL_Ti$, connected between the bit lines and the local word line WLxy. The bootstrap effect takes place thanks to a capacitive partition between the capacitances $CBL_Ci$, $CBL_Ti$, the capacitances $CeqBL_Ci$, $CeqBL_Ti$ and the gate-channel capacitance of the selection transistors that are on.

In this way, the selection transistors $T_C$ and $T_T$ of the memory units 103 belonging to the local word line WLxy are sufficiently overdriven, so as to be capable of transferring the full potential applied to the respective bit lines onto the plates of the respective storage capacitors; particularly, in the example shown in FIG. 3, the selection transistor $T_T$ of the memory unit 103 connected to the bit line pair $BL_Ci$, $BL_Ti$ is made capable of transferring the full voltage VDD present on the bit line $BL_Ti$ to the plate of the storage capacitor $C_T$.

At the instant t6, the read phase is completed, and the restore phase for restoring the storage capacitors initial polarization conditions starts. The circuit 109 brings the plate biasing line corresponding to the local plate line PLxy to ground. Therefore, the potential of the local plate line PLxy, and, thus, of the free plates of the storage capacitors $C_C$, $C_T$ of the memory units 103 of the local word line WLxy, falls toward ground. In this way, the storage capacitors that, as the capacitor $C_T$, changed polarization state are applied a potential difference equal to the voltage VDD, and, therefore, an electric field suitable to cause the polarization state to switch back to the initial state.

Once the restore phase is terminated, at the instant t7, the read circuits are disabled and the electric potential of the bit lines falls to ground.

At the instant t8, the word line WLx is deselected, and the potential thereof is brought to ground. For discharging the local word line WLxy, at the instant t9, the control signal CTLy is again asserted, thus causing the electric connection of the local word line WLxy to the word line WLx; consequently, also the potential of the local word line WLxy is brought to ground.

Finally, at the instant t10, the control signal CTLy is deasserted.

Thanks to the fact that the memory units of a given row of the matrix are not directly connected to the word line corresponding to such row, but are instead divided in groups and connected to respective local word lines, the local word lines that branch off from the selected word line but that are not selected, affect in a negligible way the selected local word line.

In fact, the presence of the MOSFETs N1, or, in general, of selective connection means for the selective connection of the local word lines to the respective word line, allows isolating the local word lines from the word line; the local word line containing the memory units which are to be accessed can, thus, be decoupled from the local word lines that contain the memory units that are not to be accessed.

The bootstrap effect can, thus, take place on the selected local word line, raising the potential thereof to the desired value, and it is not frustrated by the presence on the same matrix row of nonaccessed memory units. A bootstrap takes place only locally, where it is necessary to restore the data initially contained in the accessed memory units. At the same time, it is possible to avoid fatigue to the memory units that do not have to be accessed, with great benefits in terms of operating life of the memory.

Figure 5:
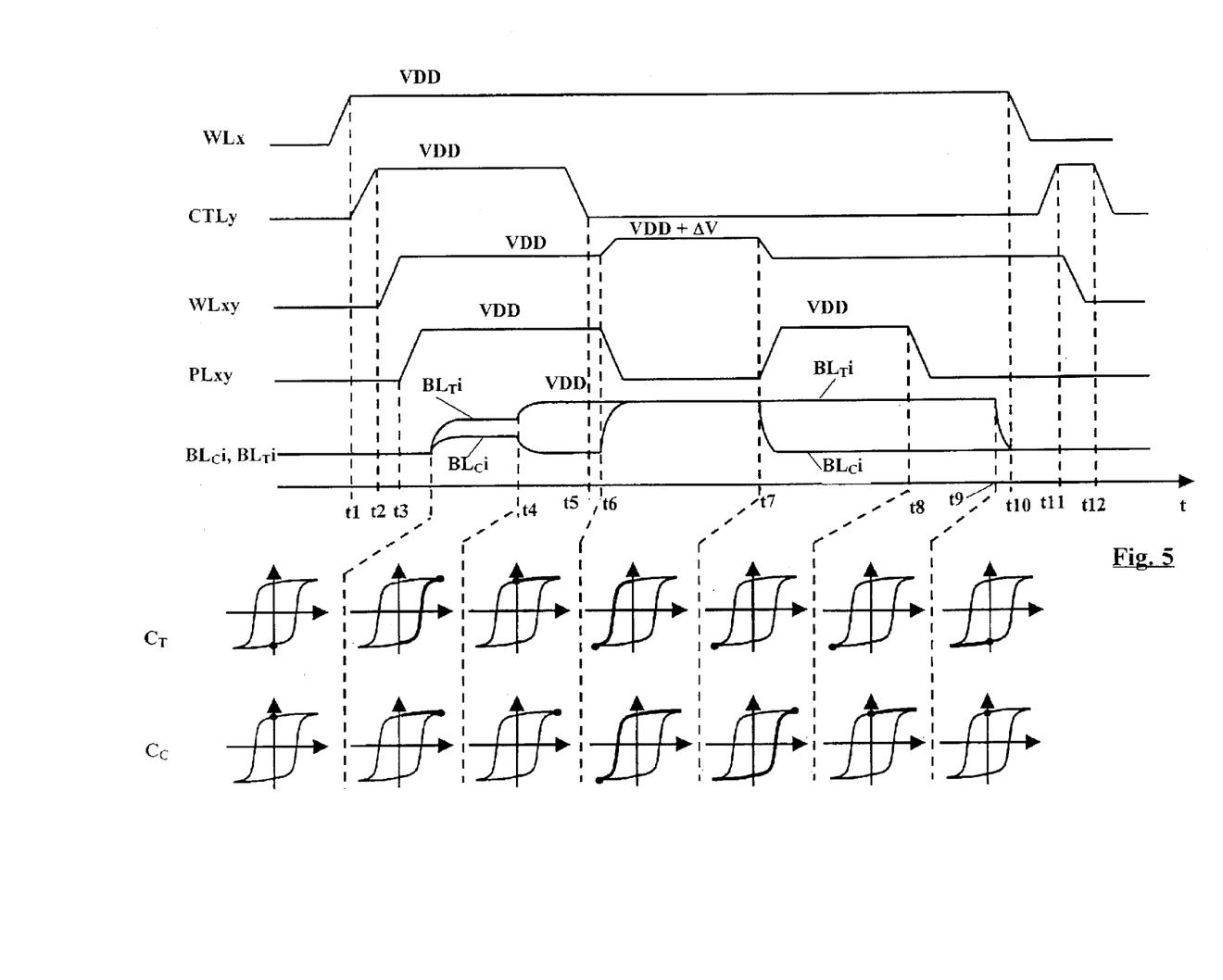
FIG. 5 is a time diagram showing the evolution in time of the main signals in the memory of FIG. 1, during a read operation carried out according to a second type of access cycle according to an embodiment of the invention.

A second type of access cycle is represented in the time diagram of FIG. 5, and will now be briefly described.

As in the preceding cycle, on the basis of the address fed to the memory, the word line selector 105 causes the selection of the word line WLx, whose electric potential, at the instant t1, is raised to a prescribed value (typically, the supply voltage VDD of the memory, for instance 5 V), adapted to cause the turning on of the selection transistors of the memory units; all the remaining word lines of the matrix 101 are brought to an electric potential (for instance, the ground) such as to inhibit the turning on of the selection transistors of the respective memory units.

Still on the basis of the address provided to the memory, the local word line selector 107 asserts, at the instant t2, the control signal CTLy corresponding to the local word line WLxy to which the memory unit to be accessed belongs. The assertion of the control signal CTLy determines the turning on of the MOSFET N1, so that the potential of the local word line WLxy progressively raises up to the potential of the word line WLx, i.e., to the voltage VDD. The remaining local word lines associated with the word line WLx are not selected, since the respective MOSFETs N1 are off.

The turning on of the selection transistors of the memory units 103 that belong to the local word line WLxy causes the connection of the respective storage capacitors, as for instance, the two capacitors $C_C$ and $C_T$, to the respective bit lines $BL_Ci$ and $BL_Ti$.

The selection of the word line WLx also causes of the MOSFET N3 to be turned on, thus, connecting the local plate lines associated with the local word lines of the word line WLx to the respective plate biasing lines PV1–PVp; the local plate lines associated with the local word lines of the remaining word lines are instead left disconnected from the plate biasing lines PV1–PVp.

Subsequent to the selection of the local word line WLxy, at the instant t3, the circuit 109 switches the plate biasing line that corresponds to the local plate line PLxy from an initial electric potential corresponding to the ground to a prescribed access electric potential to the memory units, higher and, for instance, equal to the memory supply voltage VDD. The electric potential of the local plate line PLxy, and, thus, of the free plates of the storage capacitors $C_C$, $C_T$ of the storage units 103 of the local word line WLxy, raises, therefore, toward the voltage VDD.

The electric potential of the bit lines $BL_Ci$, $BL_Ti$ evolves according to the polarization state of the storage capacitors. The storage capacitor $C_C$, initially in the state conventionally identified as "up", does not change polarization state, which is different from the storage capacitor $C_T$, initially in the "down" state, that is instead brought into the "up" state.

At the instant t4, when the respective electric potential has been established on the bit lines, the read circuits of the group to which the group of bit line pairs connected to the storage units of the local word line WLxy is associated are enabled. Due to the unbalance of the electric potential of the bit line pair associated with each memory unit (always present in a 2T2C FeRAM), the read circuits switch bringing the electric potential of the bit line $BL_Ci$ to ground and raising the electric potential of the bit line $BL_Ti$ to the voltage VDD.

Different from the first type of access cycle, the control signal CTLy is kept asserted, thus, preventing in this phase the voltage boost of the local word line WLxy, which is loaded by the parasitic capacitance of the word line WLx; the word line WLx remains substantially to the voltage VDD.

The control signal CTLy is deasserted only at the following instant t5, disconnecting the local word line WLxy from the word line WLx. Then, at the instant t6, the plate biasing line associated with the local plate line PLxy is brought to ground. Additionally, all the bit lines that, as the bit line $BL_C$is, are connected to storage capacitors that have not until now suffered polarization state changes are brought to the voltage VDD. This causes, by bootstrap effect, the voltage boost of the local word line WLxy, whose potential is brought to VDD+$\Delta$V. In this phase, all the storage capacitors of the memory units connected to the local word line WLxy switch, going into the "down" polarization state; particularly, the storage capacitors that, as the capacitor $C_T$, changed polarization state in the preceding phases, are brought to the initial polarization state.

At the instant t7, the bit lines that, as the bit line $BL_Ci$, are connected to storage capacitors initially in the "up" polarization state (such as the capacitor $C_C$), are brought to ground, and the plate biasing line associated with the local plate line PLxy is brought to the voltage VDD. The electric potential of the local word line WLxy falls back to the voltage VDD. The capacitors that, as the capacitor $C_C$, are connected to the bit lines whose electric potential has been brought to ground (such as the bit line $BL_Ci$) are brought into the original "up" polarization state.

At the instant t8, the plate biasing line associated with the local plate line PLxy is brought to ground and, at the instant t9, the remaining bit lines (such as the bit line $BL_Ti$) are also brought to ground.

At the instant t10, the word line WLx is deselected. For the local word line WLxy discharge, at the instant t11, the control signal CTLy is again asserted, thus causing the electric connection of the local word line WLxy to the word line WLx; consequently, the electric potential of the local word line WLxy is also brought to ground. Finally, at the instant t12, the control signal CTLy is deasserted.

It is observed that in this second type of access cycle, the electric potential difference between gate and drain of the selection transistors is at most equal to the voltage VDD, while in the first type of access cycle such potential can take higher values, in particular equal to (VDD+ΔV). This allows limiting the voltage across the gate oxide of the selection transistors, making it, thus, possible to use selection transistor not specifically designed for sustaining relatively high voltages and simplifying, therefore, the manufacturing process of the memory.

The access cycles described above, perfectly adapted to an FeRAM of the "2T2C" type, may, nevertheless, pose some problems if applied to an FeRAM of the "1T1C" type. It should, in fact, be kept in mind that in a "2T2C" FeRAM, each storage unit always includes a storage capacitor that changes polarization state: half of the bit lines associated with a local word line will, thus, be brought to the voltage VDD in the data restore phase, and this allows a suitable voltage boost, by bootstrap effect, of the respective local word line. The situation is different in an FeRAM of the "1T1C" type, in which it is not a priori known how many bit lines among those associated with a local word line will be brought to the voltage VDD in the restore phase. It could even happen that only one of the bit lines is brought to the voltage VDD, with the consequence that the voltage boost of the local word line could be unsufficient to overdrive the selection transistors.

Figure 6:
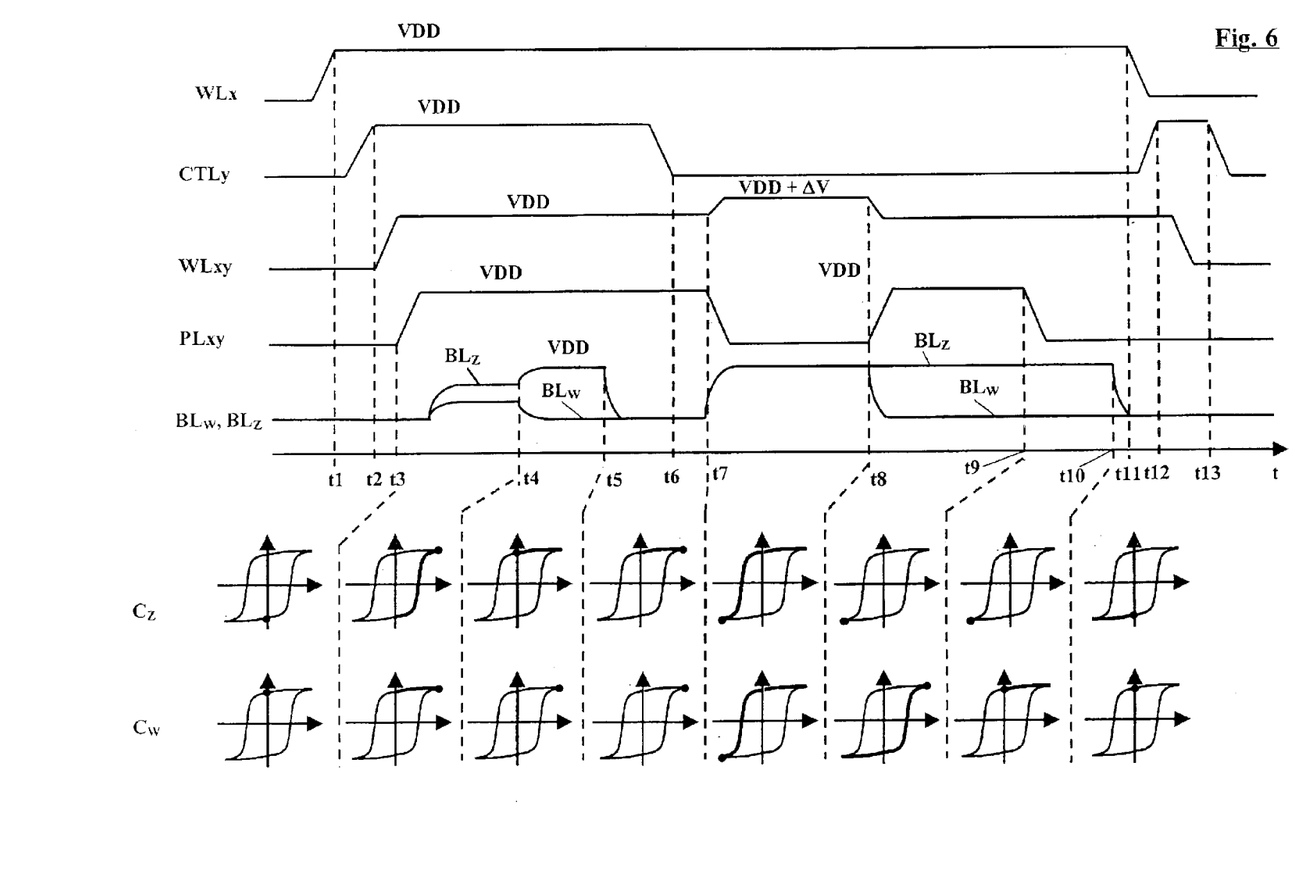
FIG. 6 is a time diagram showing the evolution in time of the main signals of another embodiment of the invention which is a memory similar to that of FIG. 1 but of the "1T1C" type, during a read operation carried out according to a third type of access cycle.

A third type of access cycle adapted to ensure a suitable voltage boost of the local word line in an FeRAM of the "1T1C" type is shown in the time diagram of FIG. 6, and will now be briefly described.

In FIG. 6, the curves identified as BLw and BLz represent the electric potential of two generic bit lines of the group of bit lines associated with the local word line WLxy; Cw and Cz, respectively, identify the storage capacitors of two memory cells of the local word line connected to the bit lines BLw and BLz; particularly, Cw is the storage capacitor of a memory cell initially in the "up" polarization state, Cz is the storage capacitor of a memory cell initially in the "down" polarization state.

As in the access cycles previously described, on the basis of the address provided to the memory, the word line selector 105 causes the selection of the word line WLx, whose electric potential, at the instant t1, is brought to a prescribed value (typically, the supply voltage VDD of the memory, for instance 5 V), adapted to determine the turning on of the selection transistors of the memory cells; all the remaining word lines of the matrix 101 are brought to an electric potential (for instance, the ground) adapted to inhibit the turning on of the selection transistors of the respective memory cells.

Still, on the basis of the address provided to the memory, the local word line selector 107 asserts, at the instant t2, the control signal CTLy corresponding to the local word line WLxy to which the memory cell to be accessed belong. The assertion of the control signal CTLy causes the MOSFET N1 to be turned on, so that the potential of the local word line WLxy progressively raises up to the potential of the word line WLx, i.e., up to the voltage VDD. The remaining local word lines associated with the word line WLx are not selected, since the respective MOSFETs N1 are off.

The turning on of the selection transistors of the memory cells 103 belonging to the local word line WLxy causes the connection of the respective storage capacitors, such as, for instance, the two capacitors Cw and Cz, to the respective bit lines BLw and BLz.

The selection of the word line WLx also causes the turning on of the MOSFET N3, and, thus, the connection of the local plate lines associated with the local word lines of the word line WLx to the respective plate biasing lines PV1–PVp; the local plate lines associated with the local word lines of the remaining word lines are instead left disconnected from the plate biasing lines PV1–PVp.

Subsequent to the selection of the local word line WLxy, at the instant t3, the circuit 109 switches the plate biasing line corresponding to the local plate line PLxy from an initial electric potential corresponding to the ground to a prescribed memory cells access electric potential, which is higher and, for instance, equal to the supply voltage VDD of the memory. The potential of the local plate line PLxy, and, thus, of the free plates of the storage capacitors $C_C$, $C_T$ of the storage units 103 of the local word line WLxy, raises, therefore, toward the voltage VDD. The read circuits of the group associated with the group of bit line pairs connected to the storage units of the local word line Wlxy are then enabled.

The potential of the bit lines BLw, BLz evolves according to the polarization state of the storage capacitors. The storage capacitor Cw, initially in the state conventionally identified as "up", does not change polarization state, which is different from the storage capacitor Cz, initially in the "down" state, that is instead brought into the "up" state.

By convention, the read circuits of an FeRAM of the "1T1C" type work by comparing the potential of the respective bit line to a reference potential.

Supposing that, at the instant t4, the read circuits have completed the reading of the memory cells, and the bit line BLw is brought to ground, while the bit line BLz is raised to the voltage VDD. The read data, present at the output of the read circuits, are stored in volatile registers.

The potential of the local word line WLxy remains at the voltage VDD, since the control signal CTLy is still asserted.

At the following instant t5, the bit lines that, as the bit line BLz, had been brought to the voltage VDD, are brought to ground. Then, at the instant t6, the control signal CTLy is deasserted, thus, disconnecting the local word line WLxy from the word line WLx.

At the instant t7, the plate biasing line associated with the local plate line PLxy is brought to ground. Additionally, all the bit lines connected to the memory cells of the local word line WLxy are brought to the voltage VDD. The raising of all the bit lines associated with the local word line WLxy to the voltage VDD causes, by bootstrap effect, the voltage boost of the local word line, The storage capacitors that, as the capacitor Cz, had undergone a polarization state transition in the preceding phases, are brought into the initial polarization state ("down"). However, the capacitors that, as the capacitor Cw, had not changed polarization state in the preceding phases, now suffer a polarization state change, being brought into the "down" state.

At the instant t8, the bit lines that, as the bit line BLws, are connected to memory cells whose storage capacitor Cw was originally in the "up" state are brought to ground, and the plate biasing line associated with the local plate line PLxy is brought to the voltage VDD. The electric potential of the local word line falls back to the voltage VDD. The capacitors that, as the capacitor Cw, had changed state in the preceding phase switch back into the initial polarization state.

At the instant t9, the plate biasing line associated with the local plate line PLxy is brought to ground and, at the instant t10, the remaining bit lines (such as the bit line BLz) are also brought to ground.

At the instant t11, the word line WLx is deselected. For discharging the local word line WLxy, at the instant t12, the control signal CTLy is again asserted, thus, causing the electric connection of the local word line WLxy to the word line WLx; consequently, the electric potential of the local word line WLxy is also brought to ground. Finally, at the instant t13, the control signal CTLy is deasserted.

This third type of access cycle ensures that, also in the case of an FeRAM of the "1T1C" type, the local word lines are adequately boosted.

Additionally, this third type of access cycle also allows limiting the voltage across the gate oxide of the selection transistors, making it, thus, possible to use selection transistor not specifically designed for sustaining relatively high voltages and, therefore, simplifying the manufacturing process of the memory.

A "2T2C" type of ferroelectric memory such as that described in conjunction with FIG. 1, or a "1T1C" type of ferroelectric memory such as that described in conjunction with FIG. 6, may form all or part of an integrated circuit such as a memory or processor. Such an integrated circuit may be included in an electronic system, such as a computer system, and may be coupled to one or more other integrated circuits.

Although the invention has been herein described in terms of some possible embodiments thereof, it is clear that those skilled in the art will be able to bring several changes to the described embodiments, as well as conceive other embodiments, without, for this reason, departing from the spirit and scope of the invention.

What is claimed is:

1. A ferroelectric semiconductor memory comprising:
an arrangement of memory units comprising at least one row of memory units, the memory units of the at least one row being associated with a respective word line of the arrangement,
a plurality of local word lines branching off from the word line associated with the at least one row, each local word line being connected to a respective group of memory units of the row,
selective connection means activatable for selectively connecting one of the local word lines to the respective word line, and
a plurality of local plate biasing lines, each one associated with the memory units of a respective group of memory units, for selectively driving the memory units of the respective groups, each local plate biasing line being connected to a respective plate biasing line through respective selective connection means, the selective connection means being controlled by the associated word line.

2. The memory according to claim 1, comprising circuit means for the selection of the at least one row, and local word line selection means controlling said selective connection means.

3. The memory according to claim 2, in which said selective connection means include a first transistor working as a switch, connected in series between the respective local word line and the respective word line.

4. The memory according to claim 3, in which said first transistors are controlled by a respective local word line selection signal provided through a second transistor.

5. The memory according to claim 1, further comprising read circuit means, for reading the information stored in the memory units belonging to the selected row.

6. The memory according to claim 1, in which the memory units are of the "2T2C" type and comprise each a pair of memory cells comprising a selection transistor and a storage capacitor with dielectric constituted by a ferroelectric material.

7. A ferroelectric semiconductor memory comprising:
an arrangement of memory units comprising at least one row of memory units, the memory units of the at least one row being associated with a respective word line of the arrangement,
a plurality of local word lines branching off from the word line associated with the at least one row, each local word line being connected to a respective group of memory units of the row,
selective connection means activatable for selectively connecting one of the local word lines to the respective word line, and
wherein the memory units are of a "1T1C" type and each comprise one memory cell having a selection transistor and a storage capacitor with dielectric constituted by a ferroelectric material.

8. A method of accessing a ferroelectric memory comprising at least one row of memory units associated with a respective word line, the method comprising:
selecting the word line;
selecting a group of memory units among the memory units associated with the word line by connecting the memory units of said group to the word line;
reading the data contained in the memory units of said group;
disconnecting the memory units of said group from the word line;
restoring the data originally contained in the memory units of said group.

9. A memory, comprising:
a global word line associated with a plurality of ferroelectric memory locations and operable to carry a selection signal;
at least one local word line coupled to a subset of the plurality of memory locations;
a first switch circuit operable to couple the local word line to the global word line;
a global plate line associated with the plurality of ferroelectric memory locations;
at least one local plate line coupled to the subset of the plurality of memory locations; and
a second switch circuit coupled to the global word line and operable to couple the local plate line to the global plate line whenever the selection signal is present on the global word line.

10. The memory of claim 9, further comprising a memory location selection circuit operable to select a memory location and operable to activate the first switch circuit that corresponds to the local word line associated with the selected memory location.

11. The memory of claim 10, further comprising at least one sense amplifier operable to read the memory location in response to the selection of the memory location.

12. The memory of claim 9, wherein the memory location comprises:
at least one capacitor; and
at least one transistor coupled to the at least one capacitor.

13. An electronic system, comprising:
a memory including:

a global word line associated with a plurality of ferroelectric memory locations and operable to carry a selection signal;

at least one local word line associated with a subset of the plurality of memory locations;

a switch circuit associated with the at least one local word line and operable to couple the local word line with the global word line;

a global plate line associated with the plurality of ferroelectric memory locations;

at least one local plate line coupled to the subset of the plurality of memory locations; and a second switch circuit coupled to the global word line and operable to couple the local plate line to the global plate line whenever the selection signal is present on the global word line.

14. The system of claim 13, further comprising a processor coupled to the memory.

15. A method comprising:

activating a global word line;

coupling a global plate line to a local plate line in response to the activated global word line, the local plate line being coupled to a ferroelectric memory cell; and uncoupling the global word line from a local word line that is coupled to the ferroelectric memory cell without uncoupling the local plate line from the global plate line.

16. The method of claim 15, further comprising reading the memory cell by sensing a voltage on a bit line that is coupled to the memory cell.

17. The method of claim 16, further comprising restoring data stored in the memory cell after reading the memory cell.

18. The method of claim 15, wherein the uncoupling comprises deactivating a selection transistor coupled between the global word line and the local word line.

19. The method of claim 15, wherein the coupling comprises activating a selection transistor coupled between the global plate line and the local plate line in response to the activated global word line.

20. A method, comprising:

coupling a first ferroelectric memory cell in a row to a word line;

causing a second ferroelectric memory cell in the row to be uncoupled from the word line;

driving a plate of the first memory cell to a first voltage;

reading data stored in the first memory cell; and restoring the data to the first memory cell.

21. The method of claim 20 wherein activating the first memory cell comprises coupling a local word line, which is coupled to the first memory cell, to a global word line.

22. The method of claim 20 wherein driving the plate of the first memory cell comprises coupling a local plate line, which is coupled to the plate of the first memory cell, to a global plate line.

23. The method of claim 20 wherein reading the data comprises sensing a voltage on a bit line that is coupled to the first memory cell.

24. The method of claim 20 wherein restoring the data comprises:

uncoupling the first memory cell from the word line;

driving the plate of the first memory cell to a second voltage;

driving to the second voltage a bit line coupled to the first memory cell;

driving the word line to the second voltage; and coupling the first memory cell to the word line after driving the word line to the second voltage.

25. The method of claim 20 wherein restoring the data comprises:

uncoupling the first memory cell from the word line;

driving the plate of the first memory cell to a second voltage;

driving to the first voltage a bit line coupled to the first memory cell;

driving the plate to the first voltage;

driving the bit line to the second voltage if and only if the data read from the first memory cell has a first value;

driving the plate to the second voltage;

driving the bit line to the second voltage;

driving the word line to the second voltage; and coupling the first memory cell to the word line after driving the word line to the second voltage.

26. The method of claim 20 wherein restoring the data comprises:

driving to a second voltage a bit line coupled to the first memory cell;

uncoupling the first memory cell from the word line;

driving the plate of the first memory cell to the second voltage;

driving the bit line to the first voltage;

driving the plate to the first voltage;

driving the bit line to the second voltage if and only if the data read from the first memory cell has a first value;

driving the plate to the second voltage;

driving the bit line to the second voltage;

driving the word line to the second voltage; and coupling the first memory cell to the word line after driving the word line to the second voltage.

* * * * *